(12) United States Patent
Sotoku (10) Patent No.: US 11,036,142 B2
(45) Date of Patent: Jun. 15, 2021

(54) SUBSTRATE PROCESSING METHOD AND SUBSTRATE PROCESSING DEVICE

(71) Applicant: SCREEN Holdings Co., Ltd., Kyoto (JP)

(72) Inventor: Kota Sotoku, Kyoto (JP)

(73) Assignee: SCREEN Holdings Co., Ltd.

( * ) Notice: Subject to any disclaimer, the term of this patent is extended or adjusted under 35 U.S.C. 154(b) by 176 days.

(21) Appl. No.: 16/079,149

(22) PCT Filed: Feb. 14, 2017

(86) PCT No.: PCT/JP2017/005338
§ 371 (c)(1),
(2) Date: Aug. 23, 2018

(87) PCT Pub. No.: WO2017/163672
PCT Pub. Date: Sep. 28, 2017

(65) Prior Publication Data
US 2019/0043708 A1 Feb. 7, 2019

(30) Foreign Application Priority Data

Mar. 25, 2016 (JP) .............................. JP2016-061911

(51) Int. Cl.
*G03F 7/42* (2006.01)
*H01L 21/304* (2006.01)
(Continued)

(52) U.S. Cl.
CPC ................ *G03F 7/42* (2013.01); *G03F 7/423* (2013.01); *G03F 7/427* (2013.01); *H01L 21/027* (2013.01);
(Continued)

(58) Field of Classification Search
CPC ...................................................... G03F 7/423
See application file for complete search history.

(56) References Cited

U.S. PATENT DOCUMENTS

| | | | |
|---|---|---|---|
| 2009/0255558 A1 | 10/2009 | Inukai et al. | 134/30 |
| 2010/0304554 A1 | 12/2010 | Hidaka et al. | 438/514 |
| 2014/0206195 A1* | 7/2014 | Lauerhaas | H01L 21/32134 |
| | | | 438/700 |

FOREIGN PATENT DOCUMENTS

| | | |
|---|---|---|
| JP | 2003-077824 A | 3/2003 |
| JP | 2004-327537 A | 11/2004 |

(Continued)

OTHER PUBLICATIONS

International Preliminary Report on Patentability (Chapter I) dated Oct. 4, 2018 with a Notification from the International Bureau (Form PCT/IB/338) in corresponding PCT International Application No. PCT/JP2017/005338 in English.

(Continued)

*Primary Examiner* — Kathleen Duda
(74) *Attorney, Agent, or Firm* — Ostrolenk Faber LLP (57) ABSTRACT

The substrate processing method is a substrate processing method for removing a resist having a hardened layer from a substrate on a surface of which the resist is formed, including: a substrate holding step of holding the substrate; and a resist stripping step of stripping the resist from the surface of the substrate by supplying ozone gas and superheated steam to a plural-fluid nozzle for producing liquid drops through mixing a plurality of fluids to discharge mixed gas of ozone gas and superheated steam containing liquid drops of ozone water produced by mixing ozone gas and superheated steam from the plural-fluid nozzle toward the surface of the substrate.

8 Claims, 8 Drawing Sheets

(51) Int. Cl.
*H01L 21/311* (2006.01)
*H01L 21/67* (2006.01)
*H01L 21/027* (2006.01)

(52) U.S. Cl.
CPC ...... *H01L 21/304* (2013.01); *H01L 21/31133* (2013.01); *H01L 21/67028* (2013.01); *H01L 21/67051* (2013.01)

(56) References Cited

FOREIGN PATENT DOCUMENTS

| | | |
|---|---|---|
| JP | 2005-150460 A | 6/2005 |
| JP | 2007-266636 A | 10/2007 |
| JP | 2008-115899 A | 5/2008 |
| JP | 2008-288355 A | 11/2008 |
| JP | 2009-016497 A | 1/2009 |
| JP | 2010-087419 A | 4/2010 |
| JP | 2010-194417 A | 9/2010 |
| JP | 5757003 B1 | 7/2015 |

OTHER PUBLICATIONS

International Search Report dated May 16, 2017 in corresponding PCT International Application No. PCT/JP2017/005338.

\* cited by examiner

(Liquid drops of ozone water + ozone gas + superheated steam)

FIG. 8A  Resist stripping step S3

FIG. 8B  Resist residue removing step S4

FIG. 9  Resist stripping step S3

FIG. 10

SUBSTRATE PROCESSING METHOD AND SUBSTRATE PROCESSING DEVICE

CROSS-REFERENCE TO RELATED APPLICATIONS

The present application is a 35 U.S.C. §§ 371 national phase conversion of PCT/JP2017/005338, filed Feb. 14, 2017, which claims priority to Japanese Patent Application No. 2016-061911, filed Mar. 25, 2016, the contents of both of which are incorporated herein by reference. The PCT International Application was published in the Japanese language.

TECHNICAL FIELD

The present invention relates to a substrate processing method and a substrate processing apparatus for removing a resist having a hardened layer from a substrate on a surface of which the resist is formed. Examples of substrates to be processed include semiconductor wafers, substrates for liquid crystal displays, substrates for plasma displays, substrates for FEDs (Field Emission Display), substrates for optical disks, substrates for magnetic disks, substrates for magneto-optical disks, substrates for photomasks, ceramic substrates, and substrates for solar cells.

BACKGROUND ART

There has been conventionally proposed in a processing apparatus of single-substrate-processing type adapted to processing substrates one by one an approach of removing a resist from a surface of a substrate without ashing by supplying a resist removing liquid having a high oxidizing power to the surface of the substrate. In a wafer where ion injection with a high dose is executed, a resist may be carbonized and altered (hardened) with a hardened layer formed on a surface of the resist. Approaches described in following Patent literatures 1 and 2, for example, are proposed in order to remove even a resist having a hardened layer on a surface thereof from a surface of a substrate without ashing.

Patent literature 1 describes an approach of supplying a surface of a substrate with a sulfuric acid/hydrogen peroxide mixture (SPM) at high temperature in order to destroy a hardened layer on a surface of a resist.

Further, Patent literature 2 describes an approach of producing liquid drops of water by mixing steam and water in a two-fluid nozzle to supply these liquid drops of water to a resist.

CITATION LIST

Patent Literature

Patent literature 1: Japanese Unexamined Patent Publication No. 2009-016497
Patent literature 2: Japanese Unexamined Patent Publication No. 2008-288355

SUMMARY OF INVENTION

Technical Problem

The approach of Patent literature 1 uses SPM as a resist removing liquid. However, a sulfuric acid containing solution such as SPM imposes a heavy burden on an environment. Therefore, when the sulfuric acid containing solution such as SPM is used as a processing liquid, treatment of waste liquid is troublesome. Thus, it is desired to strip a resist having a hardened layer from a surface of a substrate by using a processing fluid not containing sulfuric acid.

On the other hand, the approach of Patent literature 2 does not use a processing fluid other than a sulfuric acid containing solution. However, in order to remove a resist having a hardened layer from a surface of a substrate only by a physical force of liquid drops, a discharge pressure of liquid drops from the two-fluid nozzle is required to be set to an extremely large value. In this case, a surface of a substrate may incur a severe damage.

Accordingly, a purpose of the present invention is to provide a substrate processing method and a substrate processing apparatus that can favorably remove, without causing a severe damage on a surface of a substrate, a resist having a hardened layer on a surface thereof from a surface of a substrate by using a processing fluid not containing sulfuric acid.

Solution to Problem

This invention provides a substrate processing method for removing a resist having a hardened layer from a substrate on a surface of which the resist is formed, including: a substrate holding step of holding the substrate; and a resist stripping step of stripping the resist from the surface of the substrate by supplying ozone gas and superheated steam to a plural-fluid nozzle for producing liquid drops through mixing a plurality of fluids to discharge mixed gas of ozone gas and superheated steam containing liquid drops of ozone water produced by mixing ozone gas and superheated steam from the plural-fluid nozzle toward the surface of the substrate.

Superheated steam is steam at a temperature beyond a boiling point of water (this is true through the entire of this description).

According to this method, in the plural-fluid nozzle, superheated steam is cooled to be condensed through the mixing with ozone gas, whereby liquid drops are produced. Ozone gas dissolves into these liquid drops, whereby liquid drops of ozone water are produced. Thus, mixed gas of ozone gas and superheated steam containing liquid drops of ozone water is discharged from the plural-fluid nozzle, and this mixed gas is supplied to the resist.

The hardened layer is destroyed by collision of liquid drops of the ozone water to the hardened layer. Liquid drops produced by condensation of superheated steam have small diameters. Therefore, the hardened layer can be destroyed while a damage applied on the surface of the substrate is kept low.

Further, superheated steam is at an extremely high temperature and thus has an extremely high heat energy. Therefore, superheated steam supplied to the resist has an extremely high penetration force. This superheated steam passes the hardened layer on a surface of the resist to penetrate into an inside of the hardened layer (has a high penetration force). At this time, ozone gas supplied to the resist, along with superheated steam, penetrates into a raw resist (unhardened resist) in the inside of the hardened layer. By action (oxidizing action) of ozone gas penetrating into the inside of the hardened layer, carbon bond included in the raw resist is cut. As a result, the raw resist in the inside of the hardened layer can be stripped from the surface of the substrate.

Further, a much larger quantity of ozone gas is supplied to the inside of the hardened layer through a portion destroyed by liquid drops of ozone water in the hardened layer. Thus, a large quantity of ozone gas is supplied to the inside of the hardened layer, whereby the raw resist in the inside of the hardened layer can be stripped from the surface of the substrate much more effectively.

As described above, destroying of the raw resist by liquid drops of ozone water and stripping of the raw resist in the inside of the hardened layer by ozone gas can be performed concurrently. This raw resist can be washed away along with the hardened layer by stripping the raw resist in the inside of the hardened layer from the surface of the substrate, whereby the resist having the hardened layer on the surface thereof can be favorably removed from the surface of the substrate. In this case, since the resist having the hardened layer on the surface thereof can be removed from the surface of the substrate without destroying all the hardened layer and all the hardened layer is not needed to be destroyed, damage applied to the substrate can be suppressed.

Accordingly, there can be provided a substrate processing method that can preferably remove the resist having the hardened layer on the surface thereof from the surface of the substrate by using a processing fluid not containing sulfuric acid without causing a large damage on the surface of the substrate.

In one embodiment of this invention, ozone gas supplied to the plural-fluid nozzle is at room temperature.

According to this method, superheated steam is rapidly cooled through mixing with ozone gas, whereby condensation of superheated steam is facilitated.

The method may further include a resist residue removing step of removing resist residue from the surface of the substrate by supplying a processing liquid to the plural-fluid nozzle to discharge the processing liquid from the plural-fluid nozzle toward the surface of the substrate from which the resist has been stripped.

According to this method, the resist residue removing step is executed after the resist stripping step. In the resist residue removing step, the processing liquid is discharged from the plural-fluid nozzle toward the surface of the substrate by supplying the processing liquid to the plural-fluid nozzle. The supply of mixed gas of ozone gas and superheated steam in the resist stripping step and the supply of liquid drops of the chemical liquid in the resist residue removing step are executed by the common plural-fluid nozzle. Thus, between the resist stripping step and the resist residue removing step, there is not a need to exchange nozzles for discharging processing fluids, and therefore, an entire processing time can be shortened and a throughput of a process can be increased.

The resist residue removing step may include a processing liquid drop discharging step of discharging liquid drops of the processing liquid toward the surface of the substrate by supplying the processing liquid and superheated steam to the plural-fluid nozzle.

According to this method, liquid drops of the processing liquid is discharged to the surface of the substrate in the resist residue removing step. Liquid drops produced by mixing of the processing liquid and superheated steam of high temperature has a temperature higher than a liquid temperature of the processing liquid. Since liquid drops of the processing liquid at high temperature is supplied to the surface of the substrate, resist residues can be effectively removed from the surface of the substrate.

Further, the processing liquid may include a chemical liquid.

This invention provides a substrate processing apparatus, including: a substrate holding unit holding a substrate on a surface of which a resist having a hardened layer is formed; a plural-fluid nozzle for producing liquid drops through mixing a plurality of fluids to discharge the produced liquid drops toward the surface of the substrate; an ozone gas supplying unit for supplying ozone gas to the plural-fluid nozzle; a superheated steam supplying unit for supplying superheated steam to the plural-fluid nozzle, and a controller controlling the ozone gas supplying unit and the superheated steam supplying unit, wherein the controller executes a resist stripping step of stripping the resist from the surface of the substrate by supplying ozone gas and superheated steam to the plural-fluid nozzle to discharge mixed gas of ozone gas and superheated steam containing liquid drops of ozone water produced by mixing ozone gas and superheated steam from the plural-fluid nozzle toward the surface of the substrate.

According to this configuration, in the plural-fluid nozzle, superheated steam is cooled to be condensed through the mixing with ozone gas, whereby liquid drops are produced. Ozone gas dissolves into these liquid drops, whereby liquid drops of ozone water are produced. Thus, mixed gas of ozone gas and superheated steam containing liquid drops of ozone water is discharged from the plural-fluid nozzle, and this mixed gas is supplied to the resist.

The hardened layer is destroyed by collision of liquid drops of the ozone water to the hardened layer. Liquid drops produced by condensation of superheated steam have small diameters. Therefore, the hardened layer can be destroyed while a damage applied on the surface of the substrate is kept low.

Further, superheated steam is at an extremely high temperature and thus has an extremely high heat energy. Therefore, superheated steam supplied to the resist has an extremely high penetration force. This superheated steam passes the hardened layer on a surface of the resist to penetrate into an inside of the hardened layer (has a high penetration force). At this time, ozone gas supplied to the resist, along with superheated steam, penetrates into a raw resist (unhardened resist) in the inside of the hardened layer. By action (oxidizing action) of ozone gas penetrating into the inside of the hardened layer, carbon bond included in the raw resist is cut. As a result, the raw resist in the inside of the hardened layer can be stripped from the surface of the substrate.

Further, a much larger quantity of ozone gas is supplied to the inside of the hardened layer through a portion destroyed by liquid drops of ozone water in the hardened layer. Thus, a large quantity of ozone gas is supplied to the inside of the hardened layer, whereby the raw resist in the inside of the hardened layer can be stripped from the surface of the substrate much more effectively.

As described above, destroying of the raw resist by liquid drops of ozone water and stripping of the raw resist in the inside of the hardened layer by ozone gas can be performed concurrently. This raw resist can be washed away along with the hardened layer by stripping the raw resist in the inside of the hardened layer from the surface of the substrate, whereby the resist having the hardened layer on the surface thereof can be favorably removed from the surface of the substrate. In this case, since the resist having the hardened layer on the surface thereof can be removed from the surface of the substrate without destroying all the hardened layer and all the hardened layer is not needed to be destroyed, damage applied to the substrate can be suppressed.

Accordingly, there can be provided a substrate processing apparatus that can preferably remove the resist having the hardened layer on the surface thereof from the surface of the substrate by using a processing fluid not containing sulfuric acid without causing a large damage on the surface of the substrate.

Ozone gas supplied from the ozone gas supplying unit to the plural-fluid nozzle may be at room temperature.

According to this configuration, superheated steam is rapidly cooled through mixing with ozone gas, whereby condensation of superheated steam is facilitated.

The device may further include a processing liquid supplying unit for supplying a processing liquid to the plural-fluid nozzle, wherein the controller further includes the processing liquid supplying unit as an object to be controlled, and the controller further executes a resist residue removing step of removing resist residue from the surface of the substrate by supplying a processing liquid to the plural-fluid nozzle to discharge the processing liquid from the plural-fluid nozzle toward the surface of the substrate from which the resist has been stripped.

According to this configuration, the resist residue removing step is executed after the resist stripping step. In the resist residue removing step, the processing liquid is discharged from the plural-fluid nozzle toward the surface of the substrate by supplying the processing liquid to the plural-fluid nozzle. The supply of mixed gas of ozone gas and superheated steam in the resist stripping step and the supply of liquid drops of the chemical liquid in the resist residue removing step are executed by the common plural-fluid nozzle. Thus, between the resist stripping step and the resist residue removing step, there is not a need to exchange nozzles for discharging processing fluids, and therefore, an entire processing time can be shortened and a throughput of a process can be increased.

The controller may execute a processing liquid drop discharging step of discharging liquid drops of the processing liquid toward the surface of the substrate by supplying the processing liquid and superheated steam to the plural-fluid nozzle as a process included in the resist residue removing step.

According to this configuration, a mixed fluid of the processing liquid and superheated steam is discharged to the surface of the substrate in the resist residue removing step. This mixed fluid contains liquid drops of the processing liquid. Further, since liquid drops of the processing liquid are produced by mixing of the processing liquid and superheated steam of high temperature, liquid drops of the processing liquid has a temperature higher than a liquid temperature of the processing liquid. Since liquid drops of the processing liquid at high temperature are supplied to the surface of the substrate, resist residues can be effectively removed from the surface of the substrate.

The processing liquid may include a chemical liquid.

The above-described or yet other objects, features and advantages in the present invention are revealed by the following descriptions of embodiments with reference to accompanied drawings.

DESCRIPTION OF EMBODIMENTS

Figure 1:
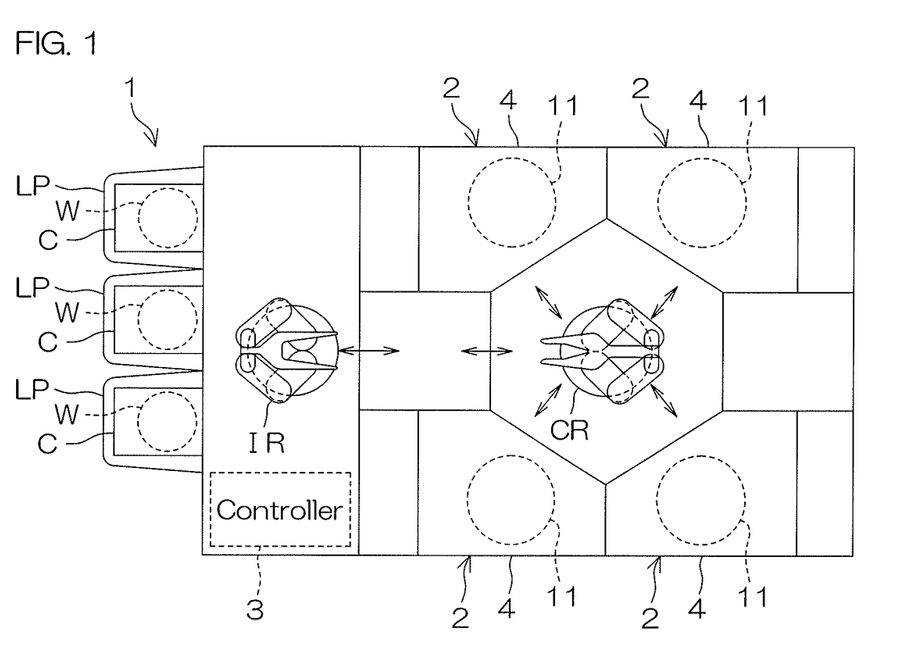
FIG. 1 is an illustrative plan view for describing a layout of an inside of a substrate processing apparatus according to one embodiment of this invention.

FIG. 1 is an illustrative plan view for describing a layout of an inside of a substrate processing apparatus 1 according to one embodiment of this invention. The substrate processing apparatus 1 is a single-substrate processing apparatus processing disk-shaped substrates W such as semiconductor wafers one by one by processing liquid or processing gas. The substrate processing apparatus 1 includes a plurality of processing units 2 processing a substrate W using processing liquid, a load port LP where a carrier C accommodating a plurality of substrates W processed in the processing unit 2, transport robots IR and CR transporting a substrate W between the load port LP and the processing unit 2, and a controller 3 controlling the substrate processing apparatus 1. The transport robots IR transports the substrate W between the carrier C and the transport robot CR. The transport robot CR transports the substrate W between the transport robots IR and the processing unit 2. The plurality of processing units 2 have a similar configuration, for example.

Figure 2:
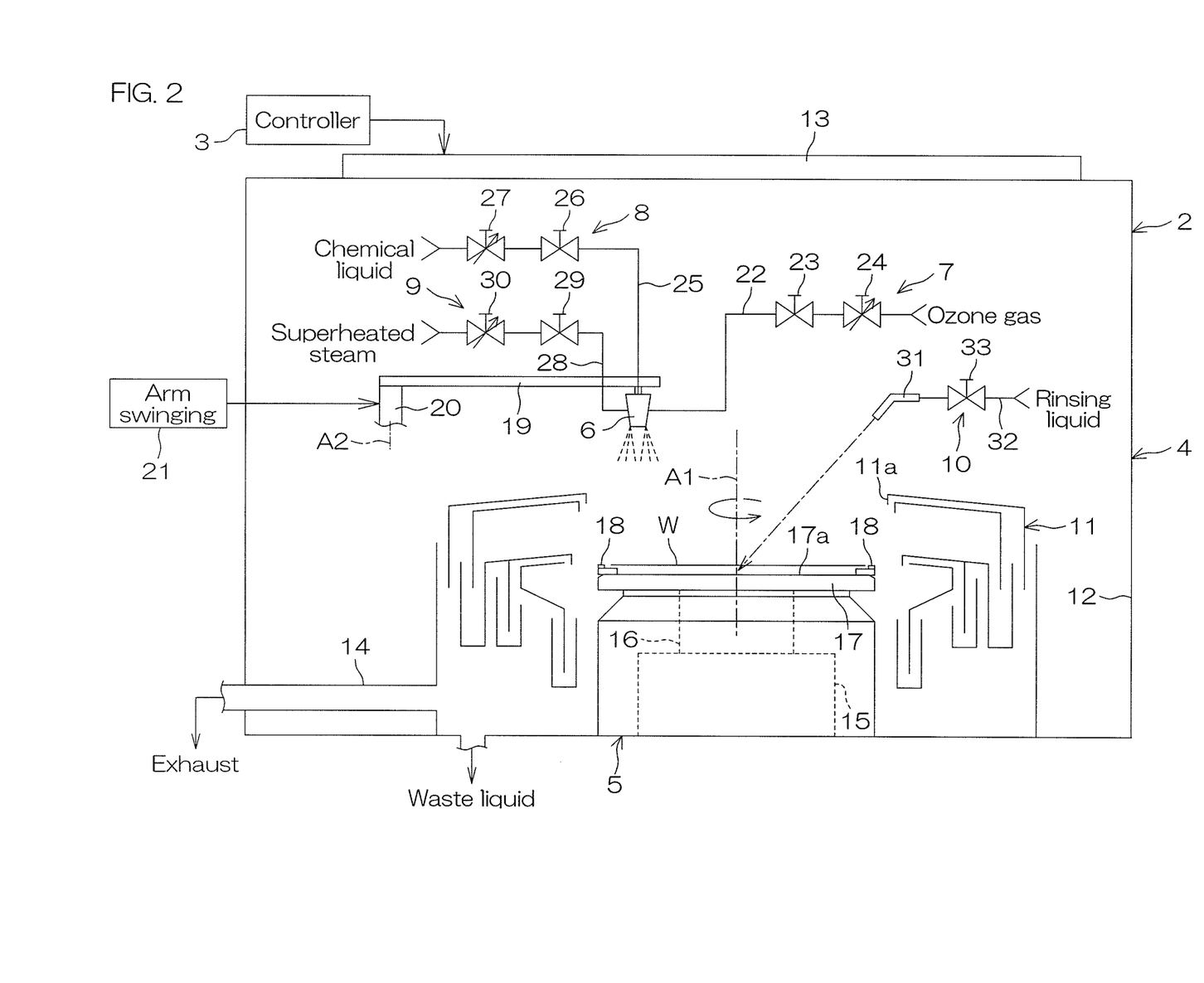
FIG. 2 is an illustrative sectional view for describing a configuration example of a processing unit provided in the substrate processing apparatus.
Figure 3:
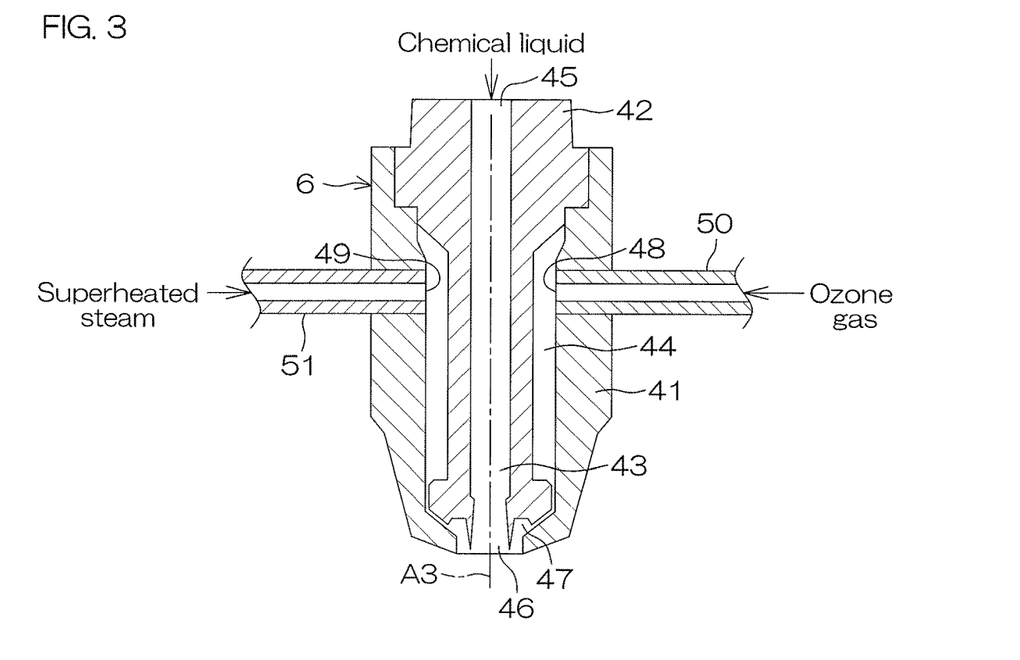
FIG. 3 is a sectional view illustratively showing a configuration of a first plural-fluid nozzle provided in the processing unit.
Figure 4:
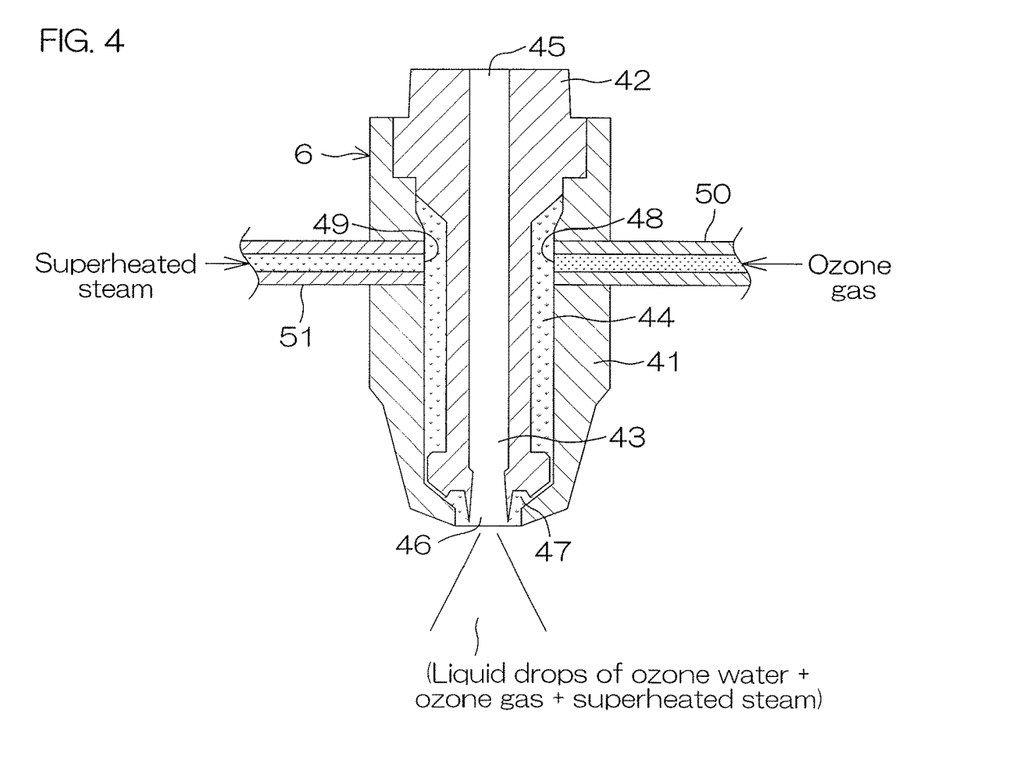
FIG. 4 shows a state where ozone gas and superheated steam are supplied to the first plural-fluid nozzle.
Figure 5:
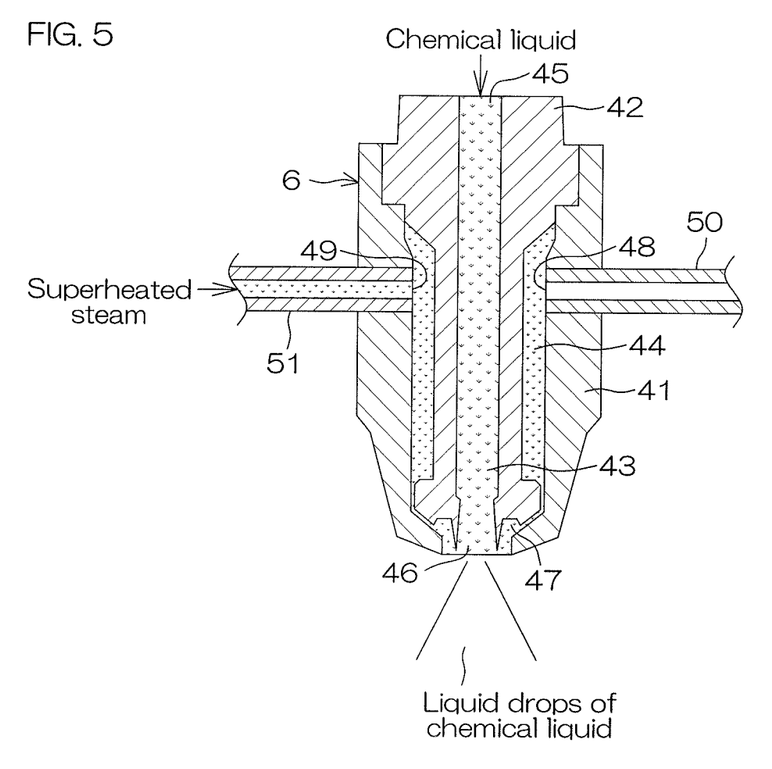
FIG. 5 shows a state where a chemical liquid and superheated steam are supplied to the first plural-fluid nozzle.

FIG. 2 is an illustrative sectional view for describing a configuration example of the processing unit 2. FIG. 3 is a sectional view illustratively showing a configuration of a first plural-fluid nozzle 6 provided in the substrate processing apparatus 1. FIG. 4 shows a state where ozone gas and superheated steam are supplied to the first plural-fluid nozzle 6. FIG. 5 shows a state where ozone gas and superheated steam are supplied to the first plural-fluid nozzle 6.

The processing unit 2 includes a box-shaped processing chamber 4 having an inner space, a spin chuck (substrate holding unit) 5 holding one substrate W in a horizontal posture within the processing chamber 4 and rotating the substrate W about a vertical rotation axis line A1 passing a center of the substrate W, the first plural-fluid nozzle 6 for producing liquid drops by mixing a plurality of fluids, an ozone gas supplying unit 7 for supplying ozone gas to the first plural-fluid nozzle 6, a chemical liquid supplying unit (processing liquid supplying unit) 8 for supplying to the first plural-fluid nozzle 6 a chemical liquid as a processing liquid for removing resist residue, a superheated steam supplying unit 9 for supplying superheated steam (steam at a temperature beyond a boiling point of water) to the first plural-fluid nozzle 6, a rinsing liquid supplying unit 10 for supplying a rinsing liquid as an example of a processing liquid to an upper surface of the substrate W held by the spin chuck 5, and a cylindrical processing cup 11 surrounding the spin chuck 5.

The processing chamber 4 includes a box-shaped partition wall 12, an FFU (fan filter unit) 13 as a blowing unit sending clean air from an upper portion of the partition wall 12 to an inside of the partition wall 12 (corresponding to an inside of the processing chamber 4), and an exhaust device (not shown) draining gas in the inside of the processing chamber 4 from a lower portion of the partition wall 12.

The FFU 13 is disposed above the partition wall 12 and is attached to a ceiling of the partition wall 12. The FFU 13 sends clean air from the ceiling of the partition wall 12 to the inside of the processing chamber 4. The exhaust device (not shown) is connected to a bottom portion of the processing cup 11 via an exhaust duct 14 connected to an inside of the processing cup 11 and sucks the inside of the processing cup 11 from the bottom portion of the processing cup 11. The FFU 13 and the exhaust device (not shown) form a down-flow (descending flow) in the inside of the processing chamber 4.

A clamping-type chuck holding horizontally the substrate W by clamping the substrate W in a horizontal direction is employed as the spin chuck 5. Specifically, the spin chuck 5 includes a spin motor 15, a spin shaft 16 integrated with a drive shaft of this spin motor 15, and a disk-shaped spin base 17 generally horizontally attached to an upper end of the spin shaft 16.

The spin base 17 includes a horizontal circular upper surface 17a having an outer diameter larger than an outer diameter of the substrate W. A plurality of (more than three; for example, six) clamping members 18 are disposed on a peripheral edge portion of the upper surface 17a. The plurality of clamping members 18 are disposed at appropriate intervals, for example, at regular intervals, on a circumference corresponding to an outer peripheral shape of the substrate W on an upper surface peripheral edge portion of the spin base 17.

Further, the spin chuck 5 is not limited to clamping types but maybe a vacuum suction type (vacuum chuck) which holds the substrate W in the horizontal posture by vacuum-sucking a rear surface of the substrate, and further rotates the substrate W held by the spin chuck 5 by rotating in this state the substrate W about the vertical rotation axis line.

The first plural-fluid nozzle 6 has a basic form as a scan nozzle which can change a supply position of a processing fluid (a first supply region D1 (see FIG. 8A) and a second supply region D2 (see FIG. 8B)) on the surface of the substrate W. The first plural-fluid nozzle 6 is attached to a tip portion of a nozzle arm 19 extending generally horizontally above the spin chuck 5. The nozzle arm 19 is supported by an arm supporting shaft 20 substantially vertically extending on a lateral side of the spin chuck 5. An arm swinging unit 21 is coupled to the arm supporting shaft 20. The first plural-fluid nozzle 6 can be moved by pivoting the arm supporting shaft 20 through a driving force of the arm swinging unit 21 to swing the nozzle arm 19. The arm swinging unit 21 swings the nozzle arm 19 about a swing axis line A2 to move the first plural-fluid nozzle 6 horizontally along an arc-shaped trajectory passing an upper surface center portion of the substrate W. Further, the arm swinging unit 21 moves horizontally the first plural-fluid nozzle 6 between a center position where a processing fluid discharged from the first plural-fluid nozzle 6 contacts the center portion of the upper surface of the substrate W and a peripheral edge position where the processing fluid discharged from the first plural-fluid nozzle 6 contacts a peripheral edge portion of the upper surface of the substrate W. Both of the center position and the peripheral edge position are treatment positions.

The ozone gas supplying unit 7 includes ozone gas line 22 supplying ozone gas at room temperature (for example, about 23° C.) from an ozone gas supply source to the first plural-fluid nozzle 6, an ozone gas valve 23 switching supply and supply stop of ozone gas from the ozone gas line 22 to the first plural-fluid nozzle 6, and an ozone gas flow rate adjusting valve 24 for adjusting a flow rate of ozone gas supplied to the first plural-fluid nozzle 6 by adjusting an opening amount of the ozone gas line 22. The ozone gas flow rate adjusting valve 24, although not shown, includes a valve body in an inside of which a valve seat is provided, a valve element opening and closing the valve seat, and an actuator moving the valve element between an open position and a closed position. This is true of other flow rate adjusting valves.

The chemical liquid supplying unit 8 includes chemical liquid line 25 supplying a chemical liquid at room temperature from a chemical liquid supply source to the first plural-fluid nozzle 6, a chemical liquid valve 26 switching supply and supply stop of the chemical liquid from the chemical liquid line 25 to the first plural-fluid nozzle 6, and a chemical liquid flow rate adjusting valve 27 for adjusting a flow rate of the chemical liquid supplied to the first plural-fluid nozzle 6 by adjusting an opening amount of the chemical liquid line 25. The chemical liquid as a resist residue removing liquid supplied to the chemical liquid line 25 is, for example, SC1 (a mixed liquid containing $NH_4OH$ and $H_2O_2$) but the chemical liquid may be SC2 (a mixed liquid containing HCl and $H_2O_2$), HF, and TMAH, not limited to SC1.

The superheated steam supplying unit 9 includes superheated steam line 28 supplying superheated steam at high temperature (temperature beyond a boiling point of water; for example, about 200° C.) from a superheated steam supply source to the first plural-fluid nozzle 6, a superheated steam valve 29 switching supply and supply stop of the superheated steam from the superheated steam line 28 to the first plural-fluid nozzle 6, and a superheated steam flow rate adjusting valve 30 for adjusting a flow rate of the superheated steam supplied to the first plural-fluid nozzle 6 by adjusting an opening amount of the superheated steam line 28.

In this embodiment, as described below, the superheated steam is supplied to the first plural-fluid nozzle 6 not only in a resist stripping step (step S3 in FIG. 7) but also in a resist residue removing step (step S4 in FIG. 7).

The rinsing liquid supplying unit 10 includes a rinsing liquid nozzle 31. The rinsing liquid nozzle 31 is, for example, a straight nozzle discharging a liquid in a state of a continuous flow and is fixedly disposed with its discharging port directed to the upper surface center portion of the substrate W above the spin chuck 5. Rinsing liquid line 32 to which the rinsing liquid from a rinsing liquid supply source is connected to the rinsing liquid nozzle 31. A rinsing liquid valve 33 for switching discharge/supply stop of the rinsing liquid from the rinsing liquid nozzle 31 is interposed in a partway portion of the rinsing liquid line 32. When the rinsing liquid valve 33 is opened, the rinsing liquid of the continuous flow supplied from the rinsing liquid line 32 to the rinsing liquid nozzle 31 is discharged from the discharging port provided on a lower end of the rinsing liquid nozzle 31. Further, when the rinsing liquid valve 33 is closed, discharging of the rinsing liquid from the rinsing liquid line 32 to the rinsing liquid nozzle 31 is stopped. The rinsing liquid is, for example, deionized water (DIW), but is not limited to DIW and may be any of carbonated water, electrolytic ion water, hydrogen water, ozone water, and hydrochloric acid water of a dilute concentration (for example, about 10 ppm to 100 ppm).

The rinsing liquid nozzle 31 is not necessarily disposed fixedly to the spin chuck 5 and may employ, for example, a form of what is called a scan nozzle which is attached above the spin chuck 5 to an arm swingable in a horizontal plane and scans by swinging of this arm a liquid contact position of the rinsing liquid on the upper surface of the substrate W.

As shown in FIG. 3, the first plural-fluid nozzle 6 is a three-fluid nozzle being capable of creating a jet flow of liquid drops by mixing a liquid and two types of gas that are different from each other. The first plural-fluid nozzle 6 has a substantially columnar outer shape. The first plural-fluid nozzle 6 includes an outer cylinder 41 configuring a casing and an inner cylinder 42 fitted in an inside of the outer cylinder 36.

The outer cylinder 41 and inner cylinder 37 are coaxially disposed respectively on a common center axis line A3 and are connected to each other. An inner space of the inner cylinder 42 serves as a linear liquid flow path 43 in which liquids from the fluid line circulates. Further, a cylindrical gas flow path 44 in which gas circulates is formed between the outer cylinder 41 and the inner cylinder 42.

The liquid flow path 43 opens at an upper end of the inner cylinder 42 as a first introducing port 45. Further, the liquid flow path 43 opens at a lower end of the inner cylinder 42 as a circle-shaped first discharging port 46 centered on the center axis line A3. A liquid introduced into the liquid flow path 43 is discharged from the first discharging port 46.

The gas flow path 44 is a cylindrical clearance having a center axis line common with the center axis line A3, and opens as a circular-ring-shaped second discharging port 47 closed at upper end portions of the outer cylinder 41 and inner cylinder 42, centered on the center axis line A3 at lower end portions of the outer cylinder 41 and inner cylinder 42 and surrounding the first discharging port 46. A lower end portion of the gas flow path 44 has a flow path area smaller than an intermediate portion of the gas flow path 44 in a length direction and has a diameter decreasing downwardly. Further, a second introducing port 48 and a third introducing port 49 respectively communicating with the gas flow path 44 are formed on an intermediate portion of the outer cylinder 41. In this embodiment, the second introducing port 48 and the third introducing port 49 are aligned in a direction along the center axis line A3 and are spaced in a circumferential direction of the outer cylinder 41.

In this embodiment, a chemical liquid from the chemical liquid line 25 is introduced into the liquid flow path 43 via the first introducing port 45. In this embodiment, the chemical liquid from the chemical liquid line 25 passes the liquid flow path 43 and is discharged from the first discharging port 46.

A first gas introducing line 50 is connected to the second introducing port 48 while penetrating the outer cylinder 41, and an inner space of the first gas introducing line 50 and the gas flow path 44 are communicated. Gas from the first gas introducing line 50 is introduced into the gas flow path 44 via this second introducing port 48. In this embodiment, ozone gas from the ozone gas line 22 is introduced into the second introducing port 48.

A second gas introducing line 51 is connected to the third introducing port 49 while penetrating the outer cylinder 41, and an inner space of the second gas introducing line 51 and the gas flow path 44 are communicated. Gas from the second gas introducing line 51 is introduced into the gas flow path 44 via this third introducing port 49. In this embodiment, superheated steam from the superheated steam line 28 is introduced into the third introducing port 49.

While the chemical liquid valve 26 is closed, the ozone gas valve 23 and the superheated steam valve 29 are opened. Thus, as shown in FIG. 4, ozone gas is introduced into the gas flow path 44 via the second introducing port 48, and at the same time, superheated steam is introduced into the gas flow path 44 via the third introducing port 49. Then, ozone gas and superheated steam are mixed in a course of passing the gas flow path 44. In the gas flow path 44, superheated steam is cooled to be condensed through the mixing with ozone gas, whereby liquid drops are produced. Ozone gas dissolves into these liquid drops, whereby liquid drops of ozone water are produced. At this time, superheated steam to condense is only part of entire superheated steam. Thus, mixed gas of ozone gas and superheated steam containing liquid drops of ozone water is discharged from the first discharging port 46 of the first plural-fluid nozzle 6 in a manner of spray.

Further, while the ozone gas valve 23 is closed, the chemical liquid valve 26 and the superheated steam valve 29 are opened. Thus, as shown in FIG. 5, superheated steam is discharged from the second discharging port 47, a chemical liquid is discharged from the first discharging port 46, and superheated steam is collided (mixed) to the chemical liquid in a vicinity of the first discharging port 46 outside the first plural-fluid nozzle 6. Thus, minute liquid drops of the chemical liquid can be produced in the first plural-fluid nozzle 6, and the first plural-fluid nozzle 6 can discharge the chemical liquid in a manner of spray. Liquid drops of the chemical liquid produced by mixing a chemical liquid at room temperature and superheated steam at high temperature has a higher temperature than a room temperature.

As described above, the first plural-fluid nozzle 6 can discharge liquid drops of different reactive chemical species.

As shown in FIG. 2, the processing cup 11 is disposed outward (in a direction away from the vertical rotation axis line A1) of the substrate W held by the spin chuck 5. The processing cup 11 surrounds the spin base 17. When a processing liquid (liquid drops of ozone water, liquid drops of water, the chemical liquid, the rinsing liquid) is supplied to the substrate W while the spin chuck 5 is rotating the substrate W, the processing liquid supplied to the substrate W is flicked off to a periphery of the substrate W. When the processing liquid is supplied to the substrate W, an upper end portion 11a of the processing cup 11 which opens upward is disposed higher than the spin base 17. Thus, the processing liquid drained to the periphery of the substrate W is received by the processing cup 11. Then, the processing liquid received by the processing cup 11 is sent to a recovery device not shown or waste liquid device not shown.

Figure 6:
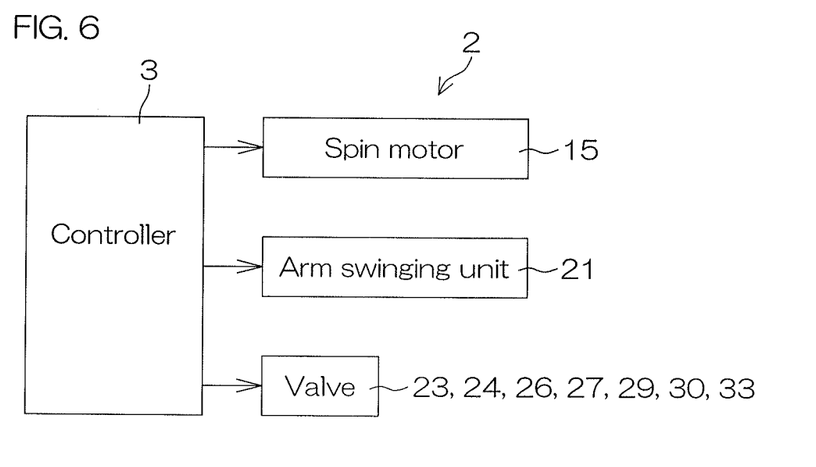
FIG. 6 is a block diagram for describing an electrical configuration of a main portion of the substrate processing apparatus.

FIG. 6 is a block diagram for describing an electrical configuration of a main portion of the substrate processing apparatus 1.

The controller 3 is configured by using a microcomputer, for example. The controller 3 has an arithmetic unit such as CPU, a storage unit such as fixed memory device and hard disk drive, and an input and output unit. A program which the arithmetic unit runs is stored in the storage unit.

The controller 3 controls the spin motor 15, the arm swinging unit 21, and the like according to a predetermined program. Further, the controller 3 opens and closes the ozone gas valve 23, the chemical liquid valve 26, the superheated steam valve 29, the rinsing liquid valve 33, and the like. Further, the controller 3 controls opening amounts of the ozone gas flow rate adjusting valve 24, the chemical liquid flow rate adjusting valve 27, the superheated steam flow rate adjusting valve 30, and the like.

Figure 7:
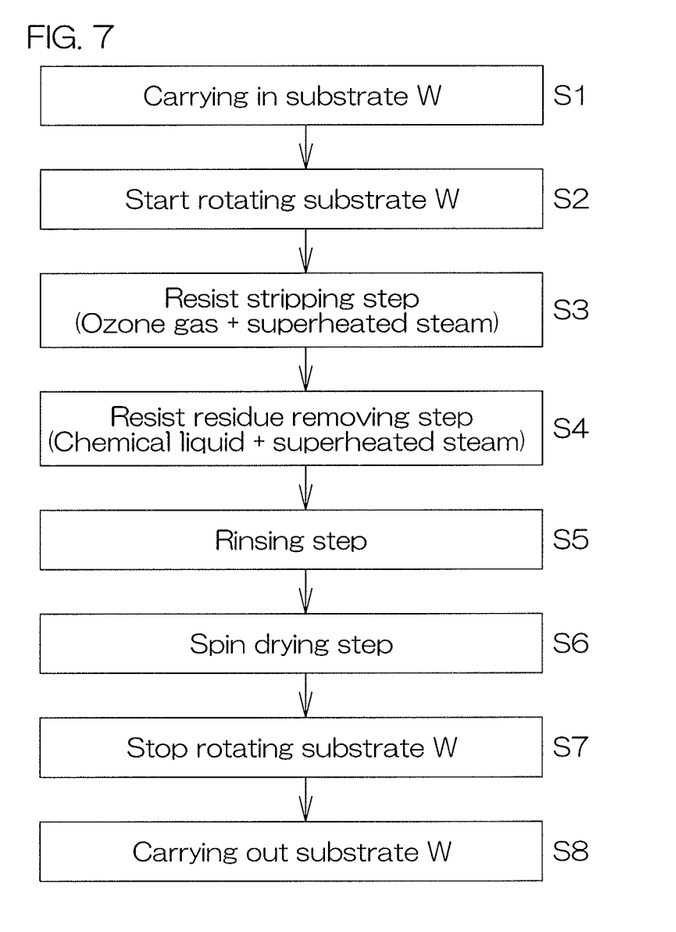
FIG. 7 is a flowchart for describing a process example of a resist removing process performed by the processing unit.
Figure 8A:
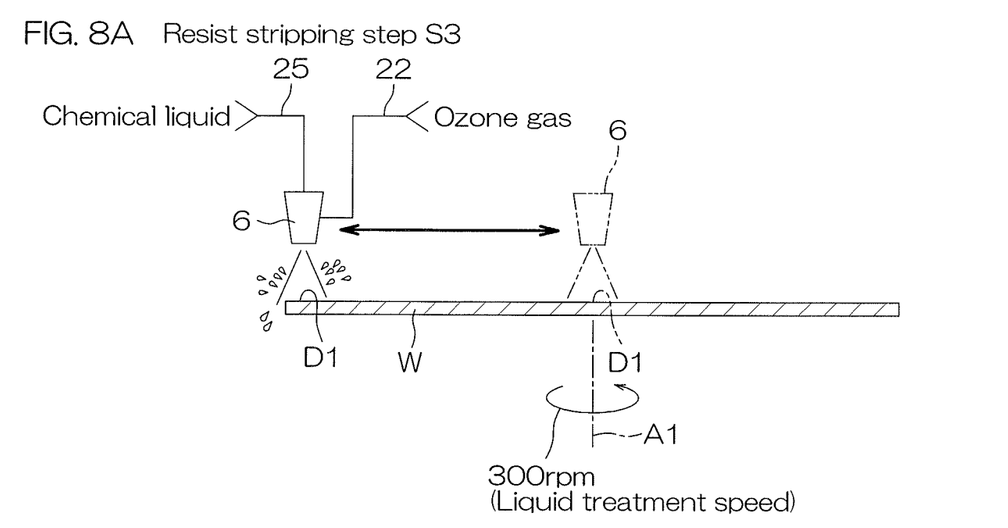
FIGS. 8A to 8B are illustrative views for describing the process example of the resist removing process.
Figure 8B:
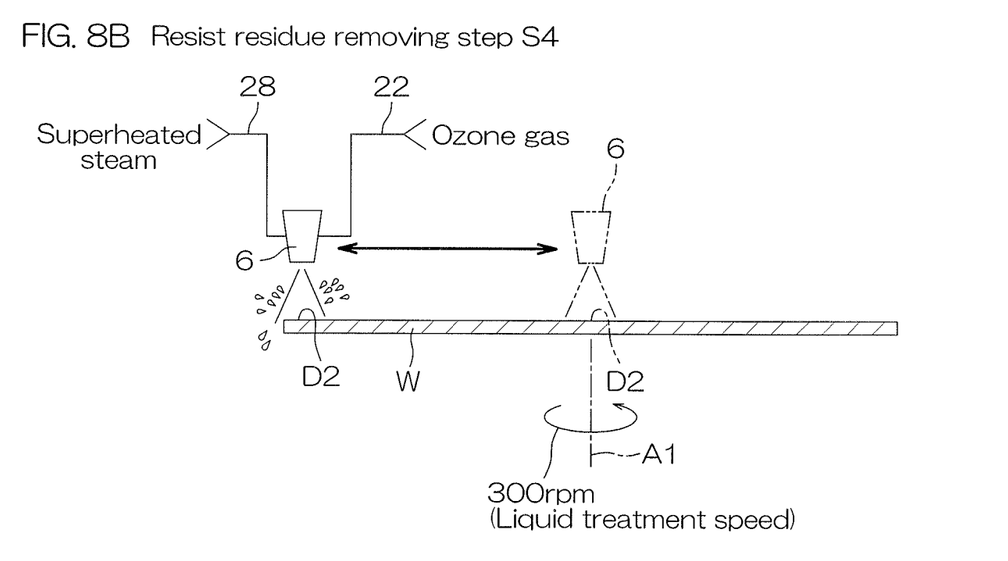
Figure 9:
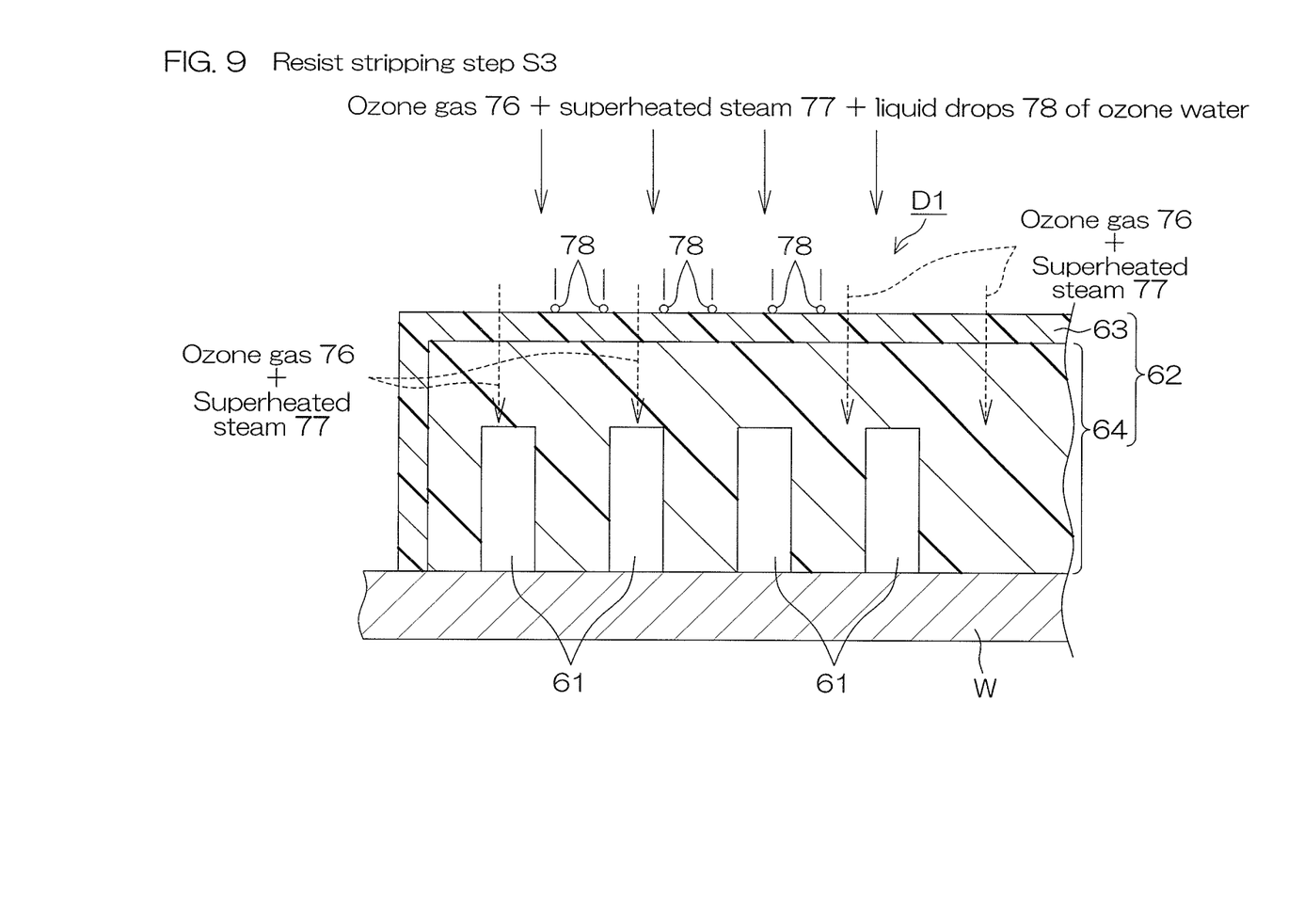
FIG. 9 is an enlarged sectional view showing a condition of a vicinity of a substrate surface in a resist stripping step.

FIG. 7 is a flowchart for describing a process example of a resist removing process executed by the processing unit 2. FIGS. 8A, 8B are illustrative views for describing the resist stripping step S3 and the resist residue removing step S4, respectively. FIG. 9 is an enlarged sectional view showing a condition of a vicinity of the surface of the substrate W in the resist stripping step S3.

In the following, the resist removing process is described with reference to FIGS. 2 to 7 and 9. FIGS. 8A, 8B are appropriately referred to.

When the substrate W is subjected to the resist removing process by the processing unit 2, the substrate W after an ion implantation treatment at a high dose is carried into an inside of the processing chamber 4 (step S1). It is assumed that the substrate W carried into is not subjected to a treatment for ashing a resist (Photoresist). That is, a pattern 61 is formed on the surface of the substrate W, and a resist 62 formed of a photosensitive resin is formed so as to cover partially or entirely the pattern 61. The pattern 61 is, for example, a fine pattern which is fine and has a high aspect ratio. A hardened layer 63 altered (hardened) by the ion injection treatment is present on a surface of the resist 62. That is, the resist 62 on the surface of the substrate W has the hardened layer 63 and an unaltered (unhardened) raw resist 64 in an inside of the hardened layer. The resist 62 includes a compound having carbon bond such as carbon-carbon unsaturated bond. Such carbon bond includes single bond of carbons and double bond of carbons.

Specifically, the controller 3 allows a hand of the substrate transfer robot CR (see FIG. 1) holding the substrate W to enter the inside of the processing chamber 4 with the first plural-fluid nozzle 6 disposed at a retreat position where the first plural-fluid nozzle 6 is retreated from above the spin chuck 5, whereby the substrate W is delivered to the spin chuck 5 with the surface of the substrate W (device forming surface) facing upward. Thus, the substrate W is held by the spin chuck 5 (substrate holding process).

Thereafter, the controller 3 starts rotation of the substrate W by the spin motor 15 (step S2). The substrate W is accelerated to a predetermined liquid treatment speed (for example, about 300 rpm within a range from 100 to 500 rpm), is raised, and then is maintained at this liquid treatment speed.

Then, the resist stripping step (step S3) for stripping the resist 62 from the substrate W is executed. The resist stripping step S3 is a step where while the substrate W is rotated, mixed gas of ozone gas 76 and superheated steam 77 containing liquid drops of ozone water is discharged in a manner of spray from the first plural-fluid nozzle 6 toward the upper surface (surface) of the substrate W.

Specifically, the controller 3 controls the arm swinging unit 21 to move the first plural-fluid nozzle 6 from the retreat position to the above-described peripheral edge position. After the first plural-fluid nozzle 6 is disposed at the peripheral edge position, the controller 3 opens the ozone gas valve 23 while closing the chemical liquid valve 26 and the superheated steam valve 29, and opens the superheated steam valve 29 after a predetermined period has passed from the opening of the ozone gas valve 23. Thus, the ozone gas 76 and the superheated steam 77 are simultaneously supplied to the first plural-fluid nozzle 6, and the supplied ozone gas 76 and superheated steam 77 are mixed in the gas flow path 44, thereby to form liquid drops of ozone water. Thus, mixed gas of the ozone gas 76 and the superheated steam 77 containing liquid drops 78 of ozone water is discharged in a manner of spray from the first discharging port 46 of the plural-fluid nozzle. Thus, this mixed gas is blew onto the upper surface (surface) of the substrate W, thereby to form the circular first supply region D1 on the upper surface of the substrate W.

Further, in the resist stripping step S3, as shown in FIG. 8A, the controller 3 controls the arm swinging unit 21 to reciprocate horizontally the first plural-fluid nozzle 6 between the peripheral edge position and the center position along an arc-shaped trajectory. Thus, the first supply region D1 can be reciprocated between the peripheral edge portion of the upper surface of the substrate W and the center portion of the upper surface of the substrate W, whereby the first supply region D1 scans an entire area of the upper surface of the substrate W. Thus, mixed gas of the ozone gas 76 and the superheated steam 77 discharged in a manner of spray from the first plural-fluid nozzle 6 and containing the liquid drops 78 of ozone water can be supplied to the entire area of the upper surface of the substrate W.

As shown in FIG. 9, at the time of supplying mixed gas of the ozone gas 76 and the superheated steam 77 to the upper surface of the substrate W, the liquid drops 78 of ozone water collide the hardened layer 63, and a physical force is applied to the first supply region D1 on the upper surface of the substrate W by the collision of liquid drops of the organic solvent. This physical force breaks the hardened layer 63.

The liquid drops 78 of ozone water contained in mixed gas of the ozone gas 76 and the superheated steam 77 have small diameters. Since liquid drops produced by mixing a liquid and gas in a plural-fluid nozzle is formed by tearing the liquid, the diameters thereof are large (for example, about 20 to 200 μm). Contrary to this, the liquid drops 78 of ozone water produced by condensing of the superheated steam 77 and further dissolving of the ozone gas have small diameters (for example, about 15 μm). Thus, in comparison to liquid drops produced by mixing of a liquid and gas, these liquid drops 78 of ozone water have a smaller physical force applied to the upper surface of the substrate W under the same discharge pressure condition. Thus, while collapse of the pattern 61 is suppressed, the hardened layer 63 can be destroyed.

Further, the superheated steam 77 supplied to the upper surface of the substrate W has an extremely high temperature (for example, about 200° C.) and thus has an extremely high heat energy. Therefore, the superheated steam 77 supplied to the resist 62 has an extremely high penetration force. This superheated steam 77 passes the hardened layer 63 on the surface of the resist 62 to penetrate an inside of the hardened layer 63 (has a high penetration force). At this time, the ozone gas 76 supplied to the resist 62, along with the superheated steam 77, penetrates the raw resist 64 in the inside of the hardened layer 63.

The ozone gas 76 has a strong oxidizing power. Further, the superheated steam 77 also has a predetermined oxidizing power. Thus, by respective oxidizing action of the ozone gas 76 and the superheated steam 77 penetrating into the inside of the hardened layer 63, carbon bond (single bond of carbons and/or double bond of carbons) included in the raw resist 64 is cut. Thus, the raw resist 64 is stripped from the surface of the substrate W.

Further, a large quantity of mixed gas of the ozone gas 76 and the superheated steam 77 (containing the liquid drops 78 of ozone water) is supplied to the inside of the hardened layer 63 through a portion destroyed by the liquid drops 78 of ozone water in the hardened layer 63 (hereinafter referred to as "the destroyed portion in the hardened layer 63). Since all of ozone gas, the superheated steam 77, and the liquid drops 78 of ozone water have an oxidizing power, the ozone gas 76, the superheated steam 77, and the liquid drops 78 of ozone water entering into the inside of the hardened layer 63 through the destroyed portion in the hardened layer 63 act on the raw resist 64, and thus, stripping of the raw resist 64 from the surface of the substrate W is further facilitated.

That is, in the resist stripping step S3, destroying of the raw resist 64 by the liquid drops 78 of ozone water and stripping of the raw resist 64 in the inside of the hardened layer 63 by ozone gas can be performed concurrently. The raw resist 64 can be washed away along with the hardened layer 63 by stripping the raw resist 64 in the inside of the hardened layer 63 from the surface of the substrate W, whereby the resist 62 having the hardened layer 63 on the surface thereof can be favorably removed from the surface of the substrate W. In this case, since the resist 62 having the hardened layer 63 on the surface thereof can be removed from the surface of the substrate W without destroying all the hardened layer 63 and all the hardened layer 63 is not needed to be destroyed, collapse of the pattern 61 can be suppressed.

Accordingly, while pattern collapse is suppressed (without causing a large damage on the surface of the substrate W), the resist 62 having the hardened layer 63 on the surface thereof can be favorably stripped from the surface of the substrate W by using a processing fluid not containing sulfuric acid (mixed gas of the ozone gas 76 and the superheated steam 77).

When a predetermined period has passed from start of discharging of mixed gas of the ozone gas 76 and the superheated steam 77, the controller 3 closes the ozone gas valve 23 and the superheated steam valve 29 to stop the discharging of mixed gas of the ozone gas 76 and the superheated steam 77 from the first plural-fluid nozzle 6. Thus, the resist stripping step S3 is finished. Thereafter, the controller 3 moves the first plural-fluid nozzle 6 to the peripheral edge position by controlling the arm swinging unit 21.

Following the finish of the resist stripping step S3, the controller 3 executes the resist residue removing step (step S4: processing liquid drop discharging step). Specifically, the controller 3 opens the chemical liquid valve 26 while closing the ozone gas valve 23 and the superheated steam valve 29 with the first plural-fluid nozzle 6 disposed at the peripheral edge position, and opens the superheated steam valve 29 after a predetermined period has passed from the opening of the chemical liquid valve 26. Thus, a chemical liquid (for example, SC1) and superheated steam are simultaneously supplied to the first plural-fluid nozzle 6, and the supplied chemical liquid and superheated steam are mixed in a vicinity of an external discharging port (first discharging port 46 (see FIG. 3)) of the first plural-fluid nozzle 6. Thus, a jet flow of minute liquid drops of the chemical liquid is formed, and the jet flow of liquid drops of the chemical liquid is discharged (liquid drops of the chemical liquid are discharged in a manner of spray) downward from the first plural-fluid nozzle 6, whereby the circular second supply region D2 is formed on the upper surface peripheral edge portion of the substrate W.

Further, in the resist residue removing step S4, as shown in FIG. 8B, the controller 3 controls the arm swinging unit 21 to reciprocate horizontally the first plural-fluid nozzle 6 between the peripheral edge position and the center position along an arc-shaped trajectory. Thus, the second supply region D2 can be reciprocated between the peripheral edge portion of the upper surface of the substrate W and the center portion of the upper surface of the substrate W, whereby the second supply region D2 scans the entire area of the upper surface of the substrate W. Thus, liquid drops of the chemical liquid discharged from the first plural-fluid nozzle 6 can be supplied to the entire area of the upper surface of the substrate W.

Further, in the resist residue removing step S4, liquid drops of the chemical liquid are discharged in a manner of spray from the first plural-fluid nozzle 6 toward the upper surface of the substrate W by supplying a chemical liquid (for example, SC1) and superheated steam to the first plural-fluid nozzle 6. Thus, a physical force is applied to the second supply region D2 on the upper surface of the substrate W by collision of liquid drops of the chemical liquid. Thus, a resist residue removing performance on the upper surface of the substrate W can be increased.

Further, liquid drops of the chemical liquid supplied to the upper surface of the substrate W has a temperature higher than room temperature since they are produced by mixing of the chemical liquid at room temperature and superheated steam at high temperature. Since liquid drops of the chemical liquid at high temperature is supplied to the surface of the substrate W, resist residues can be removed from the upper surface of the substrate W much more effectively. Thus, resist residues can be removed from the entire area of the upper surface of the substrate W.

Then, a rinsing step (step S5) of supplying the rinsing liquid to the substrate W is executed. Specifically, the controller 3 opens the rinsing liquid valve 33 to discharge the rinsing liquid from the rinsing liquid nozzle 31 toward the upper surface center portion of the substrate W. The rinsing liquid discharged from the rinsing liquid nozzle 31 contacts the upper surface center portion of the substrate W. The rinsing liquid contacting the upper surface center portion of the substrate W flows on the upper surface of the substrate W toward the peripheral edge portion of the substrate W due to a centrifugal force by rotation of the substrate W. Thus, the chemical liquid (for example, SC1) on the substrate W is swept away outwardly by the rinsing liquid to be drained to the periphery of the substrate W. Thus, the chemical liquid and resist residues are washed away on the entire area of the upper surface of the substrate W. After a predetermined period has passed from start of the rinsing step S5, the controller 3 closes the rinsing liquid valve 33 to stop the discharge of the rinsing liquid from the rinsing liquid nozzle 31.

Then, a spin drying step (step S6) of drying the substrate W is executed. Specifically, the controller 3 controls the spin motor 15 to accelerate the substrate W to a rotation speed (for example, several thousands rpm) greater than the rotation speed from the resist stripping step S3 to the rinsing step S5, thereby rotating the substrate W at the drying rotation speed. Thus, a large centrifugal force is applied to the liquid on the substrate W, and the liquid adhering to the substrate W is flicked to the periphery of the substrate W. Thus, the liquid is removed from the substrate W, and the substrate W is dried. Then, when a predetermined time has passed from the acceleration of the substrate W, the controller 3 controls the spin motor 15 to stop the rotation of the substrate W by the spin chuck 5 (step S7).

Next, the substrate W is carried out from the processing chamber 4 (step S8). Specifically, the controller 3 allows the hand of the substrate transfer robot CR to enter the inside of the processing chamber 4. Then, the controller 3 allows the hand of the substrate transfer robot CR to hold the substrate W on the spin chuck 5. Then, the controller 3 retreats the hand of the substrate transfer robot CR from the inside of the processing chamber 4. Thus, the substrate W from the surface of which the resist is removed is carried out from the processing chamber 4.

Further, in the process example shown in FIG. 7, prior to the performance of the resist residue removing step S4 or after the performance of the resist residue removing step S4, a hydrogen peroxide solution supplying step of supplying a hydrogen peroxide solution ($H_2O_2$) to the upper surface (surface) of the substrate W may be executed.

As described above, according to this embodiment, in the first plural-fluid nozzle 6, superheated steam is rapidly cooled to be condensed through the mixing with ozone gas at room temperature, whereby liquid drops are produced. Ozone gas dissolves into these liquid drops, whereby liquid drops of ozone water are produced. Thus, mixed gas of ozone gas and superheated steam containing liquid drops of ozone water is discharged from the first plural-fluid nozzle 6 in the resist stripping step S3, and this mixed gas is supplied to the resist 62.

In the resist stripping step S3, destroying of the hardened layer 63 by liquid drops of ozone water and stripping of the raw resist 64 in the inside of the hardened layer 63 by ozone gas are executed concurrently. The raw resist 64 can be washed away along with the hardened layer 63 by stripping the raw resist 64 in the inside of the hardened layer 63 from the surface of the substrate W, whereby the resist 62 having the hardened layer 63 on the surface thereof can be favorably removed from the surface of the substrate W. In this case, since the resist 62 having the hardened layer 63 on the surface thereof can be removed from the surface of the substrate W without destroying all the hardened layer 63 and all the hardened layer 63 is not needed to be destroyed, collapse of the pattern 61 can be suppressed.

Therefore, there can be provided the substrate processing apparatus 1 in which while pattern collapse is suppressed (without causing a large damage on the surface of the substrate W), the resist 62 having the hardened layer 63 on the surface thereof can be favorably stripped from the surface of the substrate W by using a processing fluid not containing sulfuric acid (mixed gas of the ozone gas and the superheated steam).

Further, in the resist residue removing step S4, liquid drops of the chemical liquid is discharged in a manner of spray from the first plural-fluid nozzle 6 toward the upper surface of the substrate W by supplying a chemical liquid (for example, SC1) and superheated steam to the first plural-fluid nozzle 6. The supply of mixed gas of ozone gas and superheated steam in the resist stripping step S3 and the supply of liquid drops of the chemical liquid in the resist residue removing step S4 are executed by the common plural-fluid nozzle. Thus, at a time of transfer from the resist stripping step S3 to the resist residue removing step S4, there is not a need to exchange nozzles for discharging processing fluids (first plural-fluid nozzle 6), and therefore, an entire processing time can be shortened and a throughput of a process can be increased.

Figure 10:
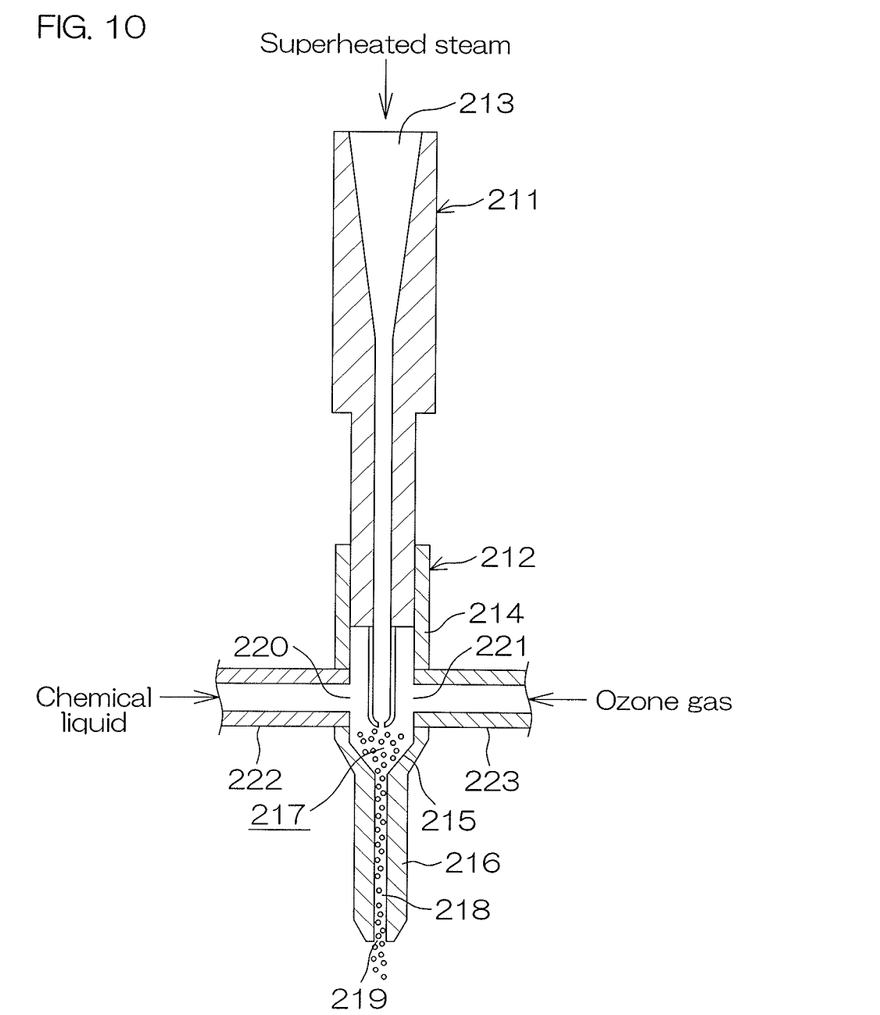
FIG. 10 is a sectional view illustratively showing a configuration of a second plural-fluid nozzle according to another embodiment of this invention.

FIG. 10 is a sectional view illustratively showing a configuration of a second plural-fluid nozzle 206 according to another embodiment of this invention.

The second plural-fluid nozzle 206 according to another embodiment of this invention is not in a mode of an external mixing type like the first plural-fluid nozzle 6 according to the above-described embodiment, but employs an internal mixing type.

The second plural-fluid nozzle 206 is a three-fluid nozzle being capable of producing a jet flow of liquid drops by mixing a liquid and two types of gas that are different from each other. The second plural-fluid nozzle 206 includes upper line 211 and lower line 212. The upper line 211 and the lower line 212 are coaxially disposed respectively on a common center axis line and are connected to each other.

A first introducing portion 213 communicating from an upper end to a lower end is formed in the upper line 211. The lower line 212 includes an upper pipe portion 214, a tapering portion 215, and a lower pipe portion 216 having a diameter smaller than that of the upper pipe portion 214. The upper pipe portion 214 is inserted into the lower end of the upper line 211 and its tip end reaches an inside of a mixing chamber 217 described below.

The mixing chamber 217 is formed in insides of the upper pipe portion 214 and tapering portion 215. In an inside of the lower pipe portion 216, a continuous flow portion 218 communicating with the mixing chamber 217 is formed below the tip end of the upper line 211. A discharging port 219 communicating with the continuous flow portion 218 is formed below a lower end of the lower pipe portion 216.

Further, a second introducing portion 220 and a third introducing portion 221 respectively communicating with the mixing chamber 217 are formed in an intermediate portion of the upper pipe portion 214. In this embodiment, the second introducing portion 220 and the third introducing portion 221 are aligned in a direction along a center axis line of the lower line 212 and are spaced in a circumferential direction of the upper pipe portion 214.

In this embodiment, superheated steam from the superheated steam line 28 (see FIG. 2) is introduced into the first introducing portion 213. Superheated steam introduced from the first introducing portion 213 is sent to the mixing chamber 217.

A liquid introducing line 222 is connected to the second introducing portion 220 while penetrating the upper pipe portion 214, and an inner space of the liquid introducing line 222 and the mixing chamber 217 are communicated. Gas from the liquid introducing line 222 is introduced into the mixing chamber 217 via the second introducing portion 220. In this embodiment, a chemical liquid from the chemical liquid line 25 (see FIG. 2) is introduced into the second introducing portion 220.

A third gas introducing line 223 is connected to the third introducing portion 221 while penetrating the upper pipe portion 214, and an inner space of the third gas introducing line 223 and the mixing chamber 217 are communicated. Gas from the third gas introducing line 223 is introduced into the mixing chamber 217 via the third introducing portion 221. In this embodiment, ozone gas from the ozone gas line 22 (see FIG. 2) is introduced into the third introducing portion 221.

While the chemical liquid valve 26 (see FIG. 2) is closed, the ozone gas valve 23 (see FIG. 2) and the superheated steam valve 29 (see FIG. 2) are opened. Thus, ozone gas is introduced into the mixing chamber 217 via the third introducing portion 221, and at the same time, superheated steam is introduced into the mixing chamber 217 via the first introducing portion 213. Then, ozone gas and superheated steam are mixed in the inside of the mixing chamber 217. In the inside of the mixing chamber 217, superheated steam is cooled to be condensed through the mixing with ozone gas, whereby liquid drops are produced. Ozone gas dissolves into these liquid drops, whereby liquid drops of ozone water are produced. Thus, mixed gas of ozone gas and superheated steam containing liquid drops of ozone water is discharged from the discharging port 219 of the second plural-fluid nozzle 206 in a manner of spray.

Further, while the ozone gas valve 23 is closed, the chemical liquid valve 26 and the superheated steam valve 29 are opened. Thus, a chemical liquid is introduced into the mixing chamber 217 via the second introducing portion 220, superheated steam is introduced into the mixing chamber 217 via the first introducing portion 213. Thus, minute liquid drops of the chemical liquid can be produced in the inside of the mixing chamber 217. Thus, the chemical liquid is discharged from the lower pipe portion 216 of the second plural-fluid nozzle 206 in a manner of spray.

As described above, the second plural-fluid nozzle 206 can discharge liquid drops of different reactive chemical species.

While the two embodiments of this invention are described above, this invention may have further another embodiment.

For example, while a temperature of ozone gas supplied to the plural-fluid nozzle 6, 206 is described as being at room temperature, this temperature of ozone gas does not need to be room temperature but maybe a temperature below the boiling point of water.

Similarly, while a temperature of the chemical liquid supplied to the plural-fluid nozzles 6, 206 is described as room temperature, this temperature of the chemical liquid does not need to be room temperature but may be a temperature below the boiling point of this chemical liquid.

Further, with respect to the above-described process example, it is described that in the resist stripping step S3, the first supply region D1 is first formed on the peripheral edge portion of the upper surface of the substrate W among the upper surface of the substrate W, the first supply region D1 may be first formed on a portion other than the peripheral edge portion of the upper surface of the substrate W (for example, the center portion or an intermediate portion between the center portion and the peripheral edge portion).

Further, it is described that at the time of transfer from the resist stripping step S3 to the resist residue removing step S4, the plural-fluid nozzle 6, 206 is returned to the peripheral edge position, it is possible that the plural-fluid nozzle 6, 206 is not returned to the peripheral edge position.

Further, it is described that at the time of transfer from the resist stripping step S3 to the resist residue removing step S4, supply of superheated steam to the plural-fluid nozzle 6, 206 is temporarily stopped, it is possible that supply of superheated steam to the plural-fluid nozzle 6, 206 is continuously performed. That is, transfer from the resist stripping step S3 to the resist residue removing step S4 may be achieved by stopping supply of ozone gas to the plural-fluid nozzle 6, 206 and starting supply of a chemical liquid to the plural-fluid nozzle 6, 206 while continuing supply of superheated steam to the plural-fluid nozzle 6, 206.

Further, in the resist residue removing step S4, only a chemical liquid is supplied to the plural-fluid nozzle 6, 206 without supplying superheated steam. In this case, the plural-fluid nozzle 6, 206 discharges not liquid drops of the chemical liquid but a continuous flow of the chemical liquid.

Further, the case where in the resist stripping step S3 and/or the resist residue removing step S4, the first and/or second supply regions D1, D2 are moved (half-scan) between the center portion of the upper surface of the substrate W and the peripheral edge portion of the upper surface of the substrate W is described as an example, the first and/or second supply regions D1, D2 may be moved (full-scan) between one peripheral edge portion of the upper surface of the substrate W and the other peripheral edge portion opposite to this one peripheral edge portion and the center portion of the upper surface.

Further, in the plural-fluid nozzle 6 or the second plural-fluid nozzle 206, an introducing position of ozone gas and an introducing position of superheated steam may be reversed from the above-described case.

Further, while in the above-described respective embodiments, the plural-fluid nozzle 6, 206 is described as the three-fluid nozzle mixing a liquid and two types of gas that are different from each other, it may be a nozzle also being capable of mixing further another kind of fluid (gas and/or liquid) in addition to these. That is, the plural-fluid nozzle 6, 206 may be a nozzle mixing four or more liquids.

Further, while in the above-described embodiments, the case where the substrate processing apparatus 1 is a device processing disk-shaped substrates, the substrate processing apparatus 1 may be a device processing polygonal substrates such as glass substrate for a liquid crystal display device.

While the embodiments of the present invention are described in detail, these are only specific examples used for clarifying technical contents of the present invention, and the present invention should not be construed as being limited to these specific examples, and the scope of the present invention is only limited by the appended claims.

This application corresponds to Japanese Patent Application No. 2016-61911 filed in Japan Patent Office on Mar. 25, 2016, the entire disclosure of which is incorporated herein by reference.

LIST OF REFERENCE NUMERALS

1: substrate processing apparatus
2: processing unit
3: controller
5: spin chuck (substrate holding unit)
6: plural-fluid nozzle
7: ozone gas supplying unit
8: chemical liquid supplying unit (processing liquid supplying unit)
9: superheated steam supplying unit
10: rinsing liquid supplying unit
62: resist
63: hardened layer
76: ozone gas
77: superheated steam
78: liquid drop of ozone water
206 plural-fluid nozzle
W substrate

The invention claimed is:

1. A substrate processing method for removing a resist having a hardened layer from a substrate on a surface of which the resist is formed, including:
a substrate holding step of holding the substrate; and
a resist stripping step of stripping the resist from the surface of the substrate, without using a processing liquid containing sulfuric acid, by supplying ozone gas and superheated steam to a plural-fluid nozzle to mix the ozone gas and the superheated steam at the plural-fluid nozzle so as to discharge mixed gas of ozone gas and superheated steam from the plural-fluid nozzle toward the surface of the substrate, the mixed gas containing liquid drops of ozone water produced by mixing the ozone gas and the superheated steam to cause mutual contact thereof at the plural-fluid nozzle.

2. A substrate processing method according to claim 1, wherein ozone gas supplied to the plural-fluid nozzle is at room temperature.

3. A substrate processing method according to claim 1, further including a resist residue removing step of removing resist residue from the surface of the substrate by supplying a processing liquid to the plural-fluid nozzle to discharge the processing liquid from the plural-fluid nozzle toward the surface of the substrate from which the resist has been stripped.

4. A substrate processing method according to claim 3, the resist residue removing step further includes a processing liquid drop discharging step of discharging liquid drops of the processing liquid toward the surface of the substrate by supplying the processing liquid and superheated steam to the plural-fluid nozzle.

5. A substrate processing method according to claim 3, wherein the processing liquid includes a chemical liquid that has a chemical constitution that is effective to react with and to remove the resist residue from the surface of the substrate.

6. A substrate processing method according to claim 1, wherein the plural-fluid nozzle has a first port and a second port separated from the first port, and including the step of supplying the ozone gas and the superheated steam to the first port and the second port, respectively, so that the mixing of the ozone gas and the superheated steam occurs at the plural-fluid nozzle.

7. A substrate processing method according to claim 1, including supplying the ozone gas to the plural-fluid nozzle at a temperature below a boiling point of water, and the liquid droplets of ozone water being produced by cooling the superheated steam with the ozone gas.

8. A substrate processing method according to claim 7, including producing the liquid droplets of ozone water by condensing the superheated steam.

\* \* \* \* \*